(12) United States Patent
Tsai et al.

(10) Patent No.: US 7,638,940 B2
(45) Date of Patent: Dec. 29, 2009

(54) ORGANIC ELECTRO-LUMINESCENCE DISPLAY HAVING PROTECTIVE FILMS

(75) Inventors: Ya-Ping Tsai, Nantou (TW); Yi-Lung Kao, Jhongli (TW); Liang-Yuan Wang, Sindian (TW); Chin-Kwang Tzen, Jiadong Township, Pingtung County (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 453 days.

(21) Appl. No.: 11/154,379

(22) Filed: Jun. 15, 2005

(65) Prior Publication Data

US 2006/0284551 A1     Dec. 21, 2006

(51) Int. Cl.
   *H01J 63/04*     (2006.01)
   *H01J 1/62*     (2006.01)
(52) U.S. Cl. .................. 313/506; 313/483; 313/498; 313/500; 313/504; 313/505; 313/512; 313/503; 428/690; 428/917
(58) Field of Classification Search ............. None
   See application file for complete search history.

(56) References Cited

U.S. PATENT DOCUMENTS

| | | | |
|---|---|---|---|
| 6,016,027 A * | 1/2000 | DeTemple et al. ......... 313/356 |
| 6,037,712 A * | 3/2000 | Codama et al. ............ 313/498 |
| 6,566,156 B1 | 5/2003 | Sturm et al. ................ 438/35 |
| 7,521,860 B2 * | 4/2009 | Tsai et al. .................. 313/506 |
| 2001/0052752 A1 | 12/2001 | Ghosh et al. ............... 313/512 |
| 2003/0052600 A1 * | 3/2003 | Sundahl et al. ............ 313/512 |
| 2003/0205845 A1 * | 11/2003 | Pichler et al. ................ 429/1 |
| 2006/0102912 A1 * | 5/2006 | Abe et al. .................... 257/88 |

* cited by examiner

*Primary Examiner*—Nimeshkumar D. Patel
*Assistant Examiner*—Natalie K Walford
(74) *Attorney, Agent, or Firm*—J.C. Patents

(57) ABSTRACT

An organic electro-luminescence display (OLED) is provided. The OLED comprises a substrate, a plurality of organic electro-luminescence devices, a first protective film, a second protective film, and a third protective film. The electro-luminescence devices are disposed over the substrate and comprise a plurality of first, second and third light organic electro-luminescence devices. The first, second and third light organic electro-luminescence devices are covered by the first, second and third protective films, respectively. By using different protective films corresponding to different light organic electro-luminescence devices, light emitted from each organic electro-luminescence device has the optimized intensity.

14 Claims, 5 Drawing Sheets

ORGANIC ELECTRO-LUMINESCENCE DISPLAY HAVING PROTECTIVE FILMS

BACKGROUND OF THE INVENTION

1. Field of the Invention

The present invention relates to an organic electro-luminescence display (OLED), and more particularly to an OLED with different protective films formed over different light organic electro-luminescence devices.

2. Description of the Related Art

Due to the advance of technology, technology with respect to semiconductor devices and displays also dramatically progresses. Among displays, organic electro-luminescence displays (OLEDs) have no restriction of view angle; low manufacturing costs; high response speed, more than one hundred folds of response speed of liquid crystal displays; low-power consumption; direct current driving function applicable to portable apparatuses; wide operational temperature range; light weight; small dimension varying with hardware; and slimness. Thus, OLEDs have met the requirements of multi-media displays. OLEDs are also very promising and may become the main trend of next-generation panel displays.

In the luminescent mechanism of an OLED, electrons and holes are met within the organic material layer to emit photons. General organic materials are vulnerable to moisture and oxidation. As a result, the material properties may be changed, which affects luminescence or even makes luminescent devices failed. Therefore, during manufacturing OLEDs, how to prevent the organic material layer being moistened and oxidized becomes an essential topic.

FIG. 1A is a cross sectional view of a portion of a conventional OLED. Referring to FIG. 1A, the conventional OLED 100 comprises a substrate 110, a plurality of organic electro-luminescence devices 120 and a protective film 130. Wherein, the organic electro-luminescence devices 120 are disposed over the substrate 110. The organic electro-luminescence devices 120 comprise red, green and blue light organic electro-luminescence devices 120a, 120b and 120c, respectively. The protective film 130 covers the organic electro-luminescence devices 120 to prevent outside moisture and oxygen from penetrating into the organic electro-luminescence devices 120 so that the material and luminescent property of the organic electro-luminescence devices 120 can be maintained. Wherein, the material of the protective film 130 usually is silicon nitride.

Another conventional OLED comprises a protective cap to prevent the outside moisture and oxygen from penetrating into the organic electro-luminescence devices. As shown in FIG. 1B, the conventional OLED 101 comprises the substrate 110, a plurality of organic electro-luminescence devices 120 and a protective cap 140. Wherein, the material of the protective cap 140 usually is glass or metal.

In these conventional OLEDs 100 and 101, red light, green light and blue light emitted from the red, green and blue light organic electro-luminescence devices 120a, 120b and 120c, respectively, have different light penetration rates to the protective film 130 or the protective cap 140 due to the different wavelengths of the red light, green light and blue light. After penetrating through the protective film 130 or the protective cap 140, red light, green light and blue light cannot achieve its optimized light intensity respectively.

SUMMARY OF THE INVENTION

Accordingly, the present invention is directed to an organic electro-luminescence display (OLED). Light emitted from every type of the electro-luminescence devices has the optimized intensity after penetrating through the protective film.

The present invention provides an OLED, which comprises a substrate, a plurality of organic electro-luminescence devices, a first protective film, a second protective film, and a third protective film. Wherein, the organic electro-luminescence devices are disposed over the substrate. The organic electro-luminescence devices comprise a plurality of first light organic electro-luminescence devices, a plurality of second light organic electro-luminescence devices and a plurality of third light organic electro-luminescence devices. The first protective film covers the first light organic electro-luminescence devices. The second protective film covers the second light organic electro-luminescence devices. The third protective film covers the third light organic electro-luminescence devices.

In a preferred embodiment, the first, the second and the third protective films have different thicknesses.

In a preferred embodiment, the first light organic electro-luminescence devices are red light organic electro-luminescence devices, the second light organic electro-luminescence devices are green light organic electro-luminescence devices, and the third light organic electro-luminescence devices are blue light organic electro-luminescence devices. A thickness of the first protective film is larger than a thickness of the second protective film, and a thickness of the second protective film is larger than a thickness of the third protective film.

In a preferred embodiment, the first protective film comprises at least one first low-refractive dielectric layer and at least one first high-refractive dielectric layer, which are alternately stacked. A material of the first low-refractive dielectric layer comprises silicon dioxide and a material of the first high-refractive dielectric layer comprises silicon nitride.

In a preferred embodiment, the second protective film comprises at least one second low-refractive dielectric layer and at least one second high-refractive dielectric layer, which are alternately stacked. A material of the second low-refractive dielectric layer comprises silicon dioxide and a material of the second high-refractive dielectric layer comprises silicon nitride.

In a preferred embodiment, the third protective film comprises at least one third low-refractive dielectric layer and at least one third high-refractive dielectric layer, which are alternately stacked. A material of the third low-refractive dielectric layer comprises silicon dioxide and a material of the third high-refractive dielectric layer comprises silicon nitride.

In a preferred embodiment, the organic electro-luminescence devices comprise a plurality of passive organic electro-luminescence devices or a plurality of active organic electro-luminescence devices.

The OLED of the present invention comprises different protective films corresponding to different light organic electro-luminescence devices. Light emitted from each organic electro-luminescence device has its optimized intensity after penetrating through the protective film. The display quality of the OLED is thus improved.

The above and other features of the present invention will be better understood from the following detailed description of the preferred embodiments of the invention that is provided in communication with the accompanying drawings.

DESCRIPTION OF SOME EMBODIMENTS

Figure 1A:
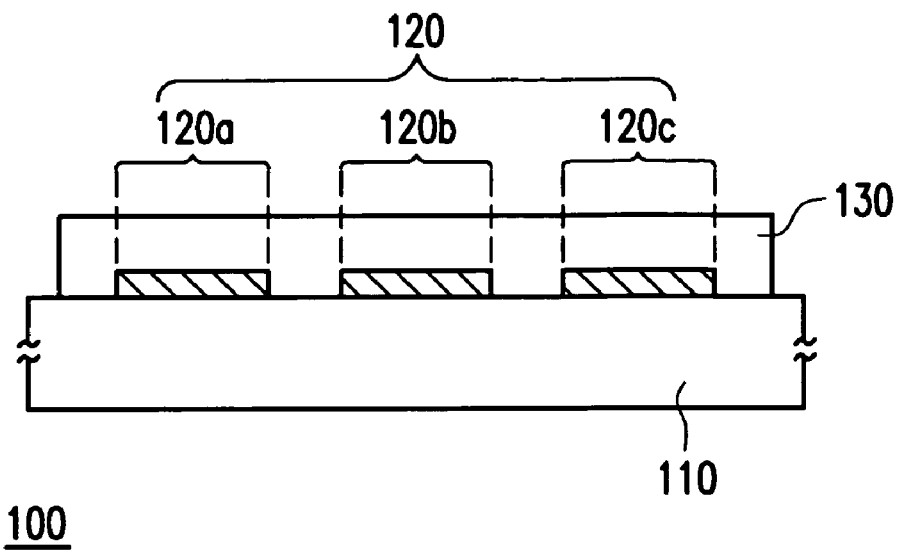
FIG. 1A is a cross sectional view of a portion of a conventional OLED.
Figure 1B:
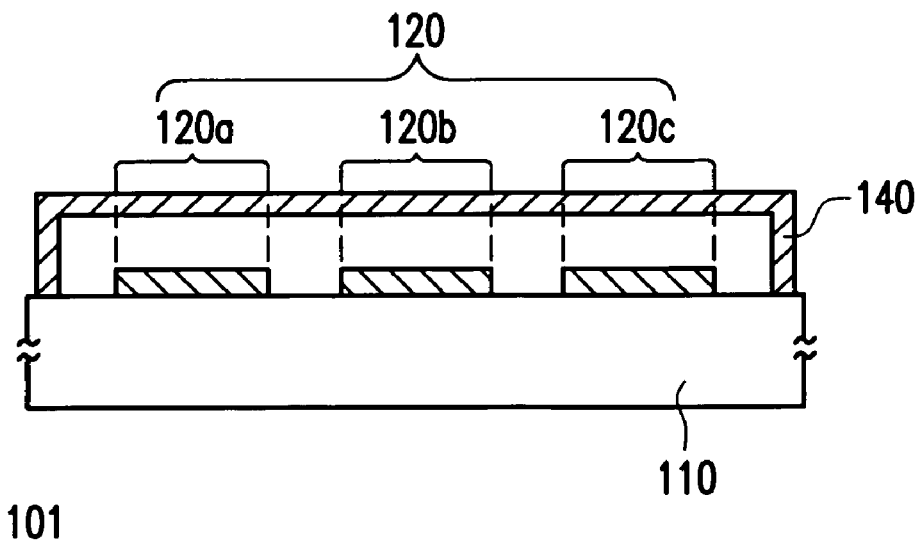
FIG. 1B is a cross sectional view of a portion of another conventional OLED.
Figure 2:
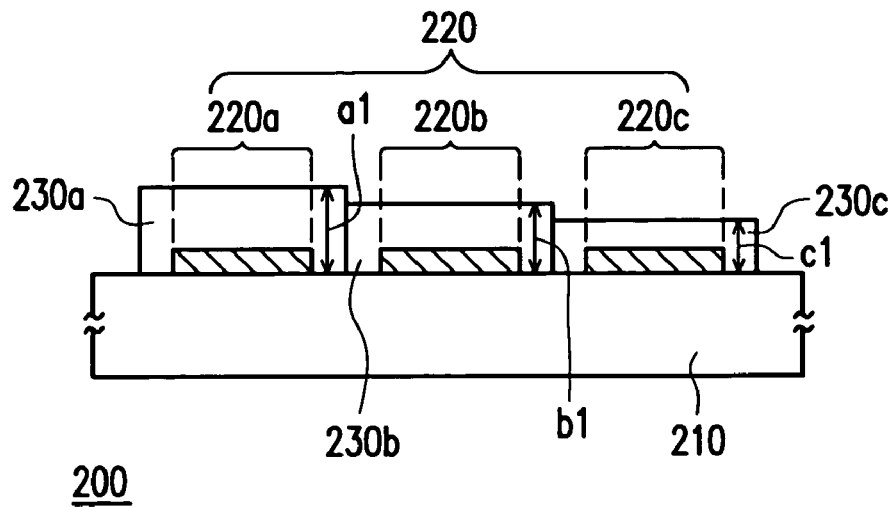
FIG. 2 is a cross sectional view of a portion of an organic electro-luminescence display (OLED) according to an embodiment of the present invention.

FIG. 2 is a cross sectional view of a portion of an organic electro-luminescence display (OLED) according to an embodiment of the present invention. Referring to FIG. 2, the OLED 200 of the present invention comprises, for example, a substrate 210, a plurality of organic electro-luminescence devices 220, a first protective film 230a, a second protective film 230b, and a third protective film 230c. Wherein, the organic electro-luminescence devices 220 are disposed over the substrate 210. The organic electro-luminescence devices 220 comprise a plurality of first light organic electro-luminescence devices 220a, a plurality of second light organic electro-luminescence devices 220b, and a plurality of third light organic electro-luminescence devices 220c. The organic electro-luminescence devices 220 can be, for example, passive organic electro-luminescence devices or active organic electro-luminescence devices.

Referring to FIG. 2, the protective films 230a, 230b and 230c cover the first light organic electro-luminescence devices 220a, the second light organic electro-luminescence devices 220b and the third light organic electro-luminescence devices 220c, respectively, to prevent the outside gas or moisture from penetrating into the organic electro-luminescence devices 220. In order to achieve the purpose that light emitted from each of organic electro-luminescence devices 220 has the optimized intensity after penetrating through the protective films 230a, 230b and 230c, the protective films 230a, 230b and 230c covering the organic electro-luminescence devices 220a, 220b and 220c, respectively, are different. In a preferred embodiment, the thickness of the first protective film 230a is a1, the thickness of the second protective film 230b is b1, and the thickness of the third protective film 230c is c1, wherein these thicknesses are different.

In a preferred embodiment, the first light organic electro-luminescence devices 220a, the second light organic electro-luminescence devices 220b and the third light organic electro-luminescence devices 220c can be, for example, red, green and blue light organic electro-luminescence devices, respectively. Additionally, the thickness a1 of the first protective film 230a is larger than the thickness b1 of the second protective film 230b. The thickness b1 of the second protective film 230b is larger than the thickness c1 of the third protective film 230c. Note that the method of forming the protective films 230a, 230b and 230c may use the same shadow mask, which is used to deposit the organic luminescence layer of the organic electro-luminescence devices 220a, 220b and 220c.

Figure 2A:
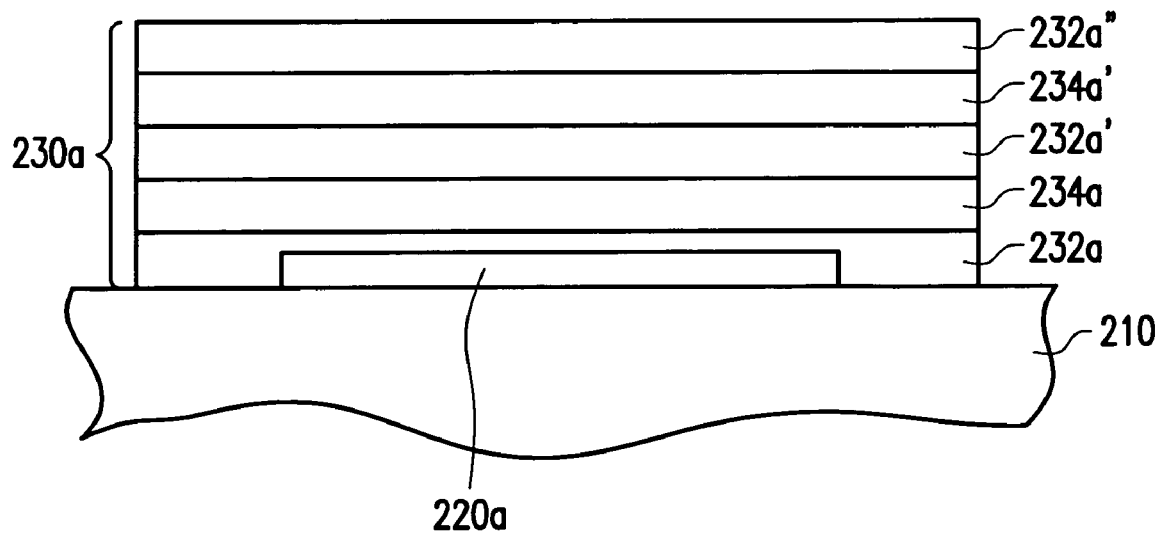
FIG. 2A is an enlarged cross sectional view showing a protective film covering a red light organic electro-luminescence device according to an embodiment of the present invention.

FIG. 2A is an enlarged cross sectional view showing a protective film covering a red light organic electro-luminescence device according to an embodiment of the present invention. Referring to FIG. 2A, in a preferred embodiment of the present invention, the protective film 230a covering the red light organic electro-luminescence devices 220a comprises at least one low-refractive dielectric layer 232a and at least one high-refractive dielectric layer 234a, wherein the low-refractive dielectric layer 232a and the high-refractive dielectric layer 234a are alternately stacked. In FIG. 2A, the protective film 230a comprises three low-refractive dielectric layers 232a, 232a' and 232a", and two high-refractive dielectric layers 234a and 234a', which are alternately stacked. The present invention, however, is not limited thereto. In an embodiment, the material of the low-refractive dielectric layers 232a, 232a' and 232a" can be, for example, silicon dioxide; and the material of the high-refractive dielectric layers 234a and 234a' can be, for example, silicon nitride.

Figure 2B:
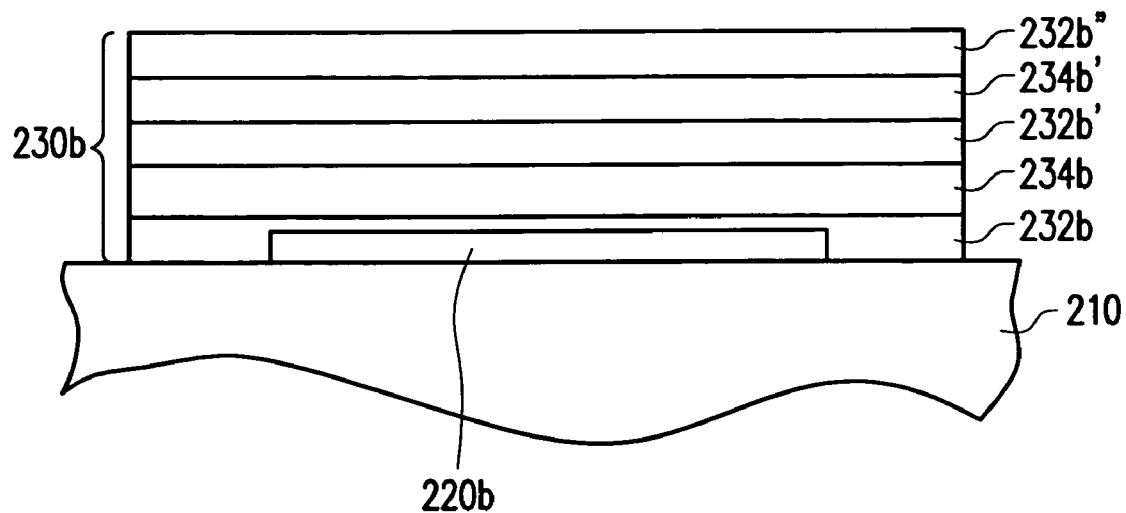
FIG. 2B is an enlarged cross sectional view showing a protective film covering a green light organic electro-luminescence device according to an embodiment of the present invention.

FIG. 2B is an enlarged cross sectional view showing a protective film covering a green light organic electro-luminescence device according to an embodiment of the present invention. Referring to FIG. 2B, compared with the protective film 230a over the red light organic electro-luminescence devices 220a, the protective film 230b over the green light organic electro-luminescence devices 220b has a larger thickness. In a preferred embodiment of the present invention, the protective film 230b covering the green light organic electro-luminescence devices 220b comprises at least one low-refractive dielectric layer 232b and at least one high-refractive dielectric layer 234b, wherein the low-refractive dielectric layer 232b and the high-refractive dielectric layer 234b are alternately stacked. In FIG. 2B, the protective film 230b comprises three low-refractive dielectric layers 232b, 232b' and 232b", and two high-refractive dielectric layers 234b and 234b', which are alternately stacked. The present invention, however, is not limited thereto. In an embodiment, the material of the low-refractive dielectric layers 232b, 232b' and 232b" can be, for example, silicon dioxide; and the material of the high-refractive dielectric layers 234b and 234b' can be, for example, silicon nitride.

Figure 2C:
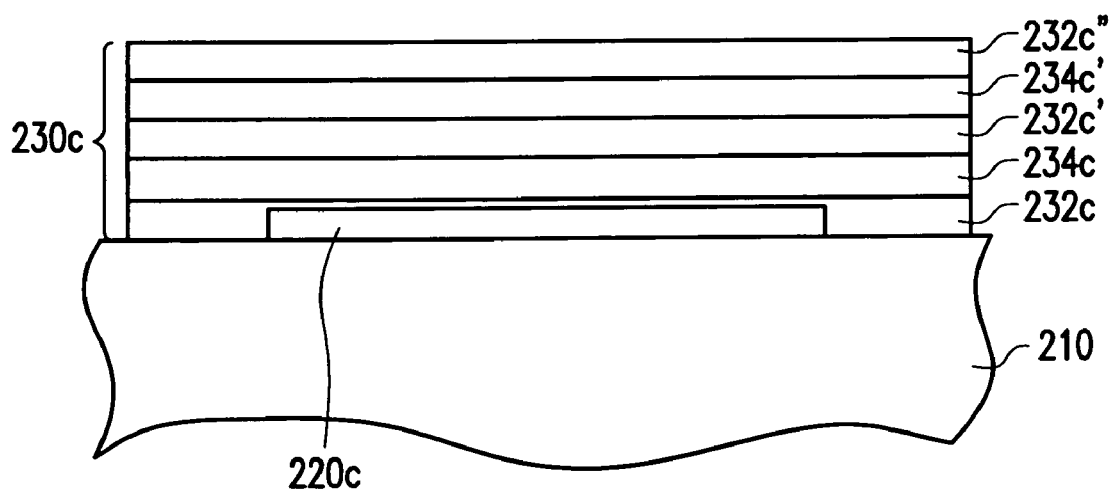
FIG. 2C is an enlarged cross sectional view showing a protective film covering a blue light organic electro-luminescence device according to an embodiment of the present invention.

FIG. 2C is an enlarged cross sectional view showing a protective film covering a blue light organic electro-luminescence device according to an embodiment of the present invention. Referring to FIG. 2C, compared with the protective film 230b over the green light organic electro-luminescence devices 220b, the protective film 230c over the blue light organic electro-luminescence devices 220c has a larger thickness. In a preferred embodiment of the present invention, the protective film 230c covering the blue light organic electro-luminescence devices 220c comprises at least one low-refractive dielectric layer 232c and at least one high-refractive dielectric layer 234c, wherein the low-refractive dielectric layer 232c and the high-refractive dielectric layer 234c are alternately stacked. In FIG. 2C, the protective film 230c comprises three low-refractive dielectric layers 232c, 232c' and 232c", and two high-refractive dielectric layers 234c and 234c', which are alternately stacked. The present invention, however, is not limited thereto. In an embodiment, the material of the low-refractive dielectric layers 232c, 232c' and 232c" can be, for example, silicon dioxide; and the material of the high-refractive dielectric layers 234c and 234c' can be, for example, silicon nitride.

In the present invention, different protective films 230a, 230b and 230c are applied to different light organic electro-luminescence devices 220a, 220b and 220c, respectively. This structure effectively prevents outside moisture and oxygen from penetrating into the organic electro-luminescence devices 220a, 220b and 220c. Damage is thus prevented. Moreover, light emitted from every light organic electro-luminescence devices 220a, 220b and 220c has the optimized light intensity after penetrating through each of the protective films 230a, 230b and 230c. Accordingly, the display quality of the OLED is improved.

Followings are experimental data indicating the relationship of the protective film structures, thicknesses wavelength and penetration rates to prove that the OLED of the present invention can achieve the desired effectiveness.

TABLE I

| Protective film structure | Refractive index of film | Film thickness (nm) |
|---|---|---|
| Low-refractive dielectric layer (silicon dioxide) | 1.45683 | 49.92 |
| High-refractive dielectric layer (silicon nitride) | 2.05201 | 8.62 |
| Low-refractive dielectric layer (silicon dioxide) | 1.45683 | 169.72 |
| High-refractive dielectric layer (silicon nitride) | 2.05201 | 50.01 |
| Low-refractive dielectric layer (silicon dioxide) | 1.45683 | 125.80 |
| Whole dielectric structure | | 404.07 |

Figure 3A:
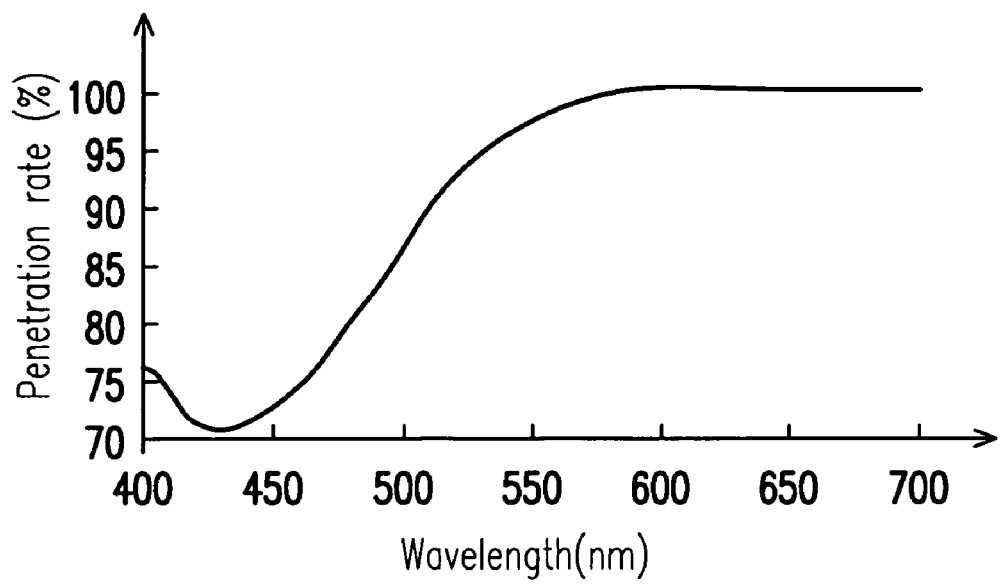
FIG. 3A is a graph showing a relationship between the penetration rate and wavelength after light penetrates through the protective film of FIG. 2A.

Table I shows the data of the protective film in FIG. 2A, wherein the material, the refractive index, and thickness of each dielectric layer are listed. FIG. 3A is a graph showing a relationship between the penetration rate and wavelength after light penetrates through the protective film of FIG. 2A. Referring to Table I, the protective film 230a comprises five dielectric layers stacked alternately. Referring to FIG. 3A, while the light penetrates through the protective film 230a, the maximum light penetration rate, near to 100%, is obtained within the scope of the wavelength between 600 nm and 700 nm, i.e., the red light range. Accordingly, after penetrating the protective film 230a, the red light emitted from the red light organic electro-luminescence devices 220a has its optimized intensity.

TABLE II

| Protective film structure | Refractive index of film | Film thickness (nm) |
|---|---|---|
| Low-refractive dielectric layer (silicon dioxide) | 1.46132 | 29.96 |
| High-refractive dielectric layer (silicon nitride) | 2.05861 | 10.86 |
| Low-refractive dielectric layer (silicon dioxide) | 1.46132 | 145.93 |
| High-refractive dielectric layer (silicon nitride) | 2.05861 | 33.86 |
| Low-refractive dielectric layer (silicon dioxide) | 1.46132 | 103.24 |
| Whole dielectric structure | | 323.86 |

Figure 3B:
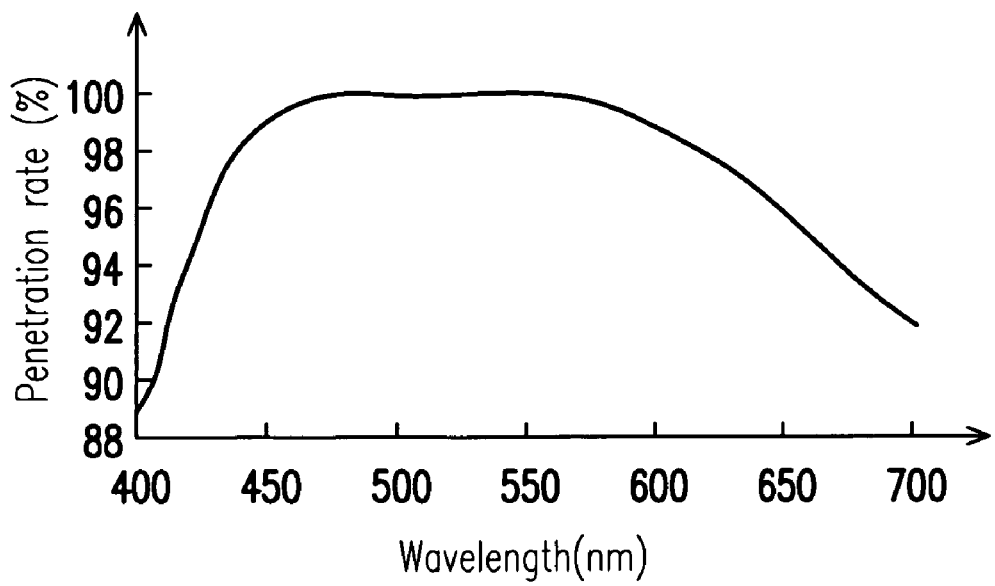
FIG. 3B is a graph showing a relationship between the penetration rate and wavelength after light penetrates through the protective film of FIG. 2B.

Table II shows the data of the protective film in FIG. 2B, wherein the material, the refractive index, and thickness of each dielectric layer are listed. FIG. 3B is a graph showing a relationship between the penetration rate and wavelength after light penetrates through the protective film of FIG. 2B. Referring to Table II, the protective film 230b comprises five dielectric layers stacked alternately. Referring to FIG. 3B, while the light penetrates through the protective film 230b, the maximum light penetration rate, near to 100%, is obtained within the scope of the wavelength from 475 nm to 550 nm, i.e., the green light range. Accordingly, after penetrating the protective film 230b, the green light emitted from the green light organic electro-luminescence devices 220b has its optimized intensity.

TABLE III

| Protective film structure | Refractive index of film | Film thickness (nm) |
|---|---|---|
| Low-refractive dielectric layer (silicon dioxide) | 1.46488 | 26.31 |
| High-refractive dielectric layer (silicon nitride) | 2.06728 | 16.35 |
| Low-refractive dielectric layer (silicon dioxide) | 1.46488 | 118.77 |
| High-refractive dielectric layer (silicon nitride) | 2.06728 | 22.32 |
| Low-refractive dielectric layer (silicon dioxide) | 1.46488 | 99.39 |
| Whole dielectric structure | | 283.14 |

Figure 3C:
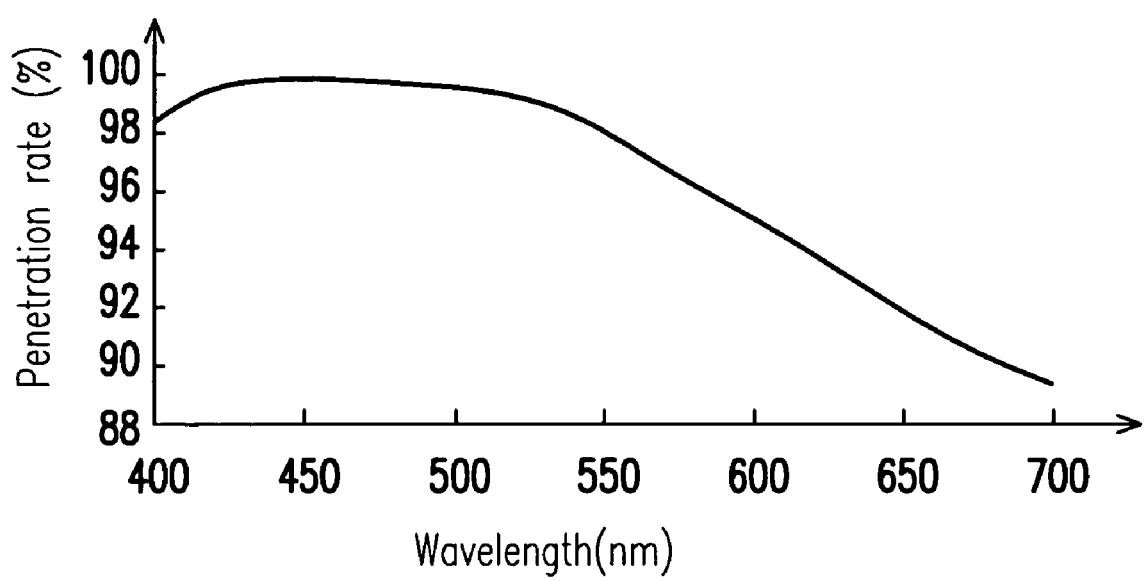
FIG. 3C is a graph showing a relationship between the penetration rate and wavelength after light penetrates through the protective film of FIG. 2C.

Table III shows the data of the protective film in FIG. 2C, wherein the material, the refractive index, and thickness of each dielectric layer are listed. FIG. 3C is a graph showing a relationship between the penetration rate and wavelength after light penetrates through the protective film of FIG. 2C. Referring to Table III, the protective film 230c comprises five dielectric layers stacked alternately. Referring to FIG. 3C, while the light penetrates through the protective film 230c, the maximum light penetration rate, near to 100%, is obtained within the scope of the wavelength from 375 nm to 475 nm, i.e., the blue light range. Accordingly, after penetrating the protective film 230c, the blue light emitted from the blue light organic electro-luminescence devices 220c has its optimized intensity.

Accordingly, the OLED of the present invention includes the following advantages.

1. Because the protective films of the OLED of the present invention comprises multiple dielectric layers which are alternately stacked, the outside oxygen and moisture are effectively prevented from penetrating into the organic electro-luminescence devices.

2. Because the OLED of the present invention comprises different protective films corresponding to different light organic electro-luminescence devices, the light emitted from each organic electro-luminescence device has the optimized intensity after penetrating through the protective film. The display quality of the OLED is thus improved.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. An organic electro-luminescence display (OLED), comprising:
   a substrate;
   a plurality of organic electro-luminescence devices, disposed over the substrate, wherein the organic electro-luminescence devices comprise a plurality of first light organic electro-luminescence devices, a plurality of second light organic electro-luminescence devices, and a plurality of third light organic electro-luminescence devices;
   a first protective film, exclusively covering the first light organic electro-luminescence devices;
   a second protective film, exclusively covering the second light organic electro-luminescence devices; and
   a third protective film, exclusively covering the third light organic electro-luminescence devices, wherein the first protective film, the second protective film, and the third protective film have different structures to optimize light penetration rates of the first light organic electro-luminescence devices, the second light organic electro-luminescence devices and the third light organic electro-luminescence devices, respectively, and the first protective film, the second protective film, and the third protective film have different thicknesses.

2. The OLED of claim 1, wherein the first light organic electro-luminescence devices are red light organic electro-luminescence devices, the second light organic electro-luminescence devices are green light organic electro-luminescence devices, and the third light organic electro-luminescence devices are blue light organic electro-luminescence devices.

3. The OLED of claim 2, wherein a thickness of the first protective film is larger than a thickness of the second protective film.

4. The OLED of claim 2, wherein a thickness of the second protective film is larger than a thickness of the third protective film.

5. The OLED of claim 1, wherein the first protective film comprises at least one first low-refractive dielectric layer and at least one first high-refractive dielectric layer, wherein the first low-refractive dielectric layer and the first high-refractive dielectric layer are alternately stacked.

6. The OLED of claim 5, wherein a material of the first low-refractive dielectric layer comprises silicon dioxide.

7. The OLED of claim 5, wherein a material of the first high-refractive dielectric layer comprises silicon nitride.

8. The OLED of claim 1, wherein the second protective film comprises at least one second low-refractive dielectric layer and at least one second high-refractive dielectric layer, wherein the second low-refractive dielectric layer and the second high-refractive dielectric layer are alternately stacked.

9. The OLED of claim 8, wherein a material of the second low-refractive dielectric layer comprises silicon dioxide.

10. The OLED of claim 8, wherein a material of the second high-refractive dielectric layer comprises silicon nitride.

11. The OLED of claim 1, wherein the third protective film comprises at least one third low-refractive dielectric layer and at least one third high-refractive dielectric layer, wherein the third low-refractive dielectric layer and the third high-refractive dielectric layer are alternately stacked.

12. The OLED of claim 11, wherein a material of the third low-refractive dielectric layer comprises silicon dioxide.

13. The OLED of claim 11, wherein a material of the third high-refractive dielectric layer comprises silicon nitride.

14. The OLED of claim 1, wherein the organic electro-luminescence devices comprise a plurality of passive organic electro-luminescence devices or a plurality of active organic electro-luminescence devices.

* * * * *